United States Patent
Hu et al.

(10) Patent No.: US 8,049,534 B2
(45) Date of Patent: Nov. 1, 2011

(54) LOW-POWER HIGH-SPEED DIFFERENTIAL DRIVER WITH PRECISION CURRENT STEERING

(75) Inventors: Yaqi Hu, Plano, TX (US); Yanli Fan, Allen, TX (US); Mark W. Morgan, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 144 days.

(21) Appl. No.: 12/705,833

(22) Filed: Feb. 15, 2010

(65) Prior Publication Data

US 2011/0199130 A1 Aug. 18, 2011

(51) Int. Cl.
*H03F 3/45* (2006.01)
(52) U.S. Cl. .......................... 327/52; 327/563
(58) Field of Classification Search .............. 327/52, 327/560–563, 109–111
See application file for complete search history.

(56) References Cited

U.S. PATENT DOCUMENTS

| | | | |
|---|---|---|---|
| 6,791,377 B2 * | 9/2004 | Ilchmann et al. | 327/108 |
| 6,847,232 B2 | 1/2005 | Tinsley et al. | |
| 7,098,700 B2 * | 8/2006 | Martinez et al. | 327/108 |
| 7,777,531 B2 * | 8/2010 | Fattaruso | 327/65 |
| 7,944,252 B1 * | 5/2011 | Bhakta et al. | 327/108 |
| 2002/0140461 A1 | 10/2002 | Enam et al. | |

FOREIGN PATENT DOCUMENTS

EP 0476341 3/1992

OTHER PUBLICATIONS

"An Ultra Low Power 10 Gbps LVDS Output Driver," Bipolar/BiCMOS Circuits and Technology Meeting, Oct. 13-15, 2008, pp. 5-8 (Khaldoon Abugharbieh, Jitendra Mohan, Devnath Varadarajan, Ivan Duzevik and Shoba Krishnan).

* cited by examiner

*Primary Examiner* — Hai L Nguyen
(74) *Attorney, Agent, or Firm* — John J. Patti; Wade J. Brady, III; Frederick J. Telecky, Jr.

(57) ABSTRACT

In bipolar CMOS or BiCMOS process technologies, drivers (such as mixed mode or hybrid mode drivers) using both bipolar and CMOS transistors (i.e., field effect transistors or FETs) may have undesirable properties, such as reduced speed, ringing, latch-up, or lower electrostatic discharge (ESD) performance. Here, a mixed or hybrid mode driver is provided that employs a current steering circuit (instead of voltages driven differential pair(s) as is done with conventional drivers) to generate pull-down currents that precisely match the voltages in the pull-up portions of driver. It increases the speed and produces smaller output common-mode voltage fluctuation over conventional drivers. Thus, the driver provided here can be produced in BiCMOS process technologies without the undesirable effects of conventional drivers.

20 Claims, 2 Drawing Sheets

US 8,049,534 B2

LOW-POWER HIGH-SPEED DIFFERENTIAL DRIVER WITH PRECISION CURRENT STEERING

TECHNICAL FIELD

The invention relates generally to differential driver and, more particularly, to mixed (or hybrid) mode differential drivers.

BACKGROUND

Referring to FIG. 1 of the drawings the reference numeral 100 generally designates a conventional circuit. Circuit 100 has a driver 102 that receives a differential input signal through input terminals INP and INN to drive a load 104 (which includes a resistance RL). Also, driver 102 generally comprises NPN transistors Q1 and Q2, NMOS transistors Q3 and Q4, resistors R1 and R2, and current source 106.

In operation, driver 102 provides currents through output terminals OUTP and OUTN to drive the load 104. When a logic high or "1" is applied to the base of transistor Q1 and a logic low or "0" is applied to the base of transistor Q2, current is sourced through transistor Q1 and resistor R1 to terminal OUTP, while transistor Q4 (because transistors Q3 and Q4 are cross-coupled) sinks current from output terminal OUTN. Alternatively, when a logic high or "1" is applied to the base of transistor Q2 and a logic low or "0" is applied to the base of transistor Q1, current is sourced through transistor Q2 and resistor R2 to terminal OUTN, while transistor Q3 (again because transistors Q3 and Q4 are cross-coupled) sinks current from output terminal OUTP.

With this configuration, though, the switching speeds of transistors Q3 and Q4 are limiting factors for the operational speed of the driver 102. In bipolar CMOS or BiCMOS processes, transistors (which are field effect transistors or FETs) have low switching speeds, so driver 102 is undesirable for integrated circuits or ICs manufactured using BiCMOS processes. Simply replacing transistors Q3 and Q4 with bipolar transistors (i.e., NPN transistors), though, to take advantage of higher switching speeds would also be undesirable because the junction diodes of the bipolar transistors would limit the output voltage swings. Additionally, because of the properties of transistors Q3 and Q4, electrostatic discharge or ESD events across terminals OUTP and OUTN may damage transistors Q3 and Q4. Moreover, use of transistors Q3 and Q4 may result in ringing and/or latch-up from positive feedback. Therefore, there is a need for an improved driver.

Some other conventional circuits are: U.S. Pat. No. 6,847,232; U.S. Patent Pre-Grant Publ. No. 2002/0140461; European Patent no. EP0476341; and Abugharbieh et al., "An ultra low power 10 Gbps LVDS output driver", *Bipolar/BiCMOS Circuits and Technology Meeting*, 2008, Oct. 13-15, 2008, Pgs. 5-8.

SUMMARY

A preferred embodiment of the present invention, accordingly, provides an apparatus. The apparatus comprises a first feed-forward resistor-capacitor (RC) network that is controlled by a first portion of a differential input signal; a second feed-forward RC network that is controlled by a second portion of a differential input signal; a first input transistor that is coupled to the first feed-forward RC network; a second input transistor that is coupled to the second feed-forward network; a first output transistor that is coupled to the first input transistor at its control electrode, wherein the ratio of the size of the first output transistor to the size of the first input transistor is N to 1, and wherein N is greater than 1; a second output transistor that is coupled to the second input transistor at its control electrode, wherein the ratio of the size of the second output transistor to the size of the second input transistor is N to 1; a first output terminal that is coupled to the first output transistor; a second output terminal that is coupled to the second output transistor; and a current source that is coupled to the first input transistor, the second input transistor, the first output transistor, and the second output transistor.

In accordance with a preferred embodiment of the present invention, the apparatus further comprises: a first input terminal that receives the second portion of the differential input signal; a second input terminal that receives the first portion of the differential input signal; a first driving transistor that is coupled to the first output transistor at its first passive electrode and that is coupled to the first input terminal at its control electrode; and a second driving transistor that is coupled to the second output transistor at its first passive electrode and that is coupled to the second input terminal at its control electrode, wherein the first driving transistor is about the same size as the second driving transistor.

In accordance with a preferred embodiment of the present invention, the current source further comprises a first current source, and wherein the apparatus further comprises: a second current source that is coupled to the first passive electrode of the first driving transistor; and a third current source that is coupled to the first passive electrode of the second driving transistor.

In accordance with a preferred embodiment of the present invention, the apparatus further comprises a bypass capacitor that is coupled between the first output transistor and the second output transistor.

In accordance with a preferred embodiment of the present invention, the apparatus further comprises: a first resistor that is coupled between the first passive electrode of the first driving transistor and a first passive electrode of the first output transistor; and a second resistor that is coupled between the first passive electrode of the second driving transistor and a first passive electrode of the second output transistor, wherein the first resistor is about the same resistance as the second resistor.

In accordance with a preferred embodiment of the present invention, the first and second feed-forward RC network each further comprise: a third resistor, wherein the ratio of the resistance of the first resistor to the resistance of the third resistor is 1 to N; and a capacitor that is coupled in parallel to the third resistor.

In accordance with a preferred embodiment of the present invention, the capacitor from each of the first and second feed-forward RC networks is coupled to the second and first input terminals, respectively.

In accordance with a preferred embodiment of the present invention, the apparatus further comprises: a third driving transistor that is coupled to the first feed-forward RC network at its first passive electrode and that is coupled to the second input terminal at its control electrode; and a fourth driving transistor that is coupled to the second feed-forward RC network at its first passive electrode and that is coupled to the first input terminal at its control electrode.

In accordance with a preferred embodiment of the present invention, N is 5.

In accordance with a preferred embodiment of the present invention, an apparatus is provided. The apparatus comprises a first feed-forward resistor-capacitor (RC) network that is controlled by a first portion of a differential input signal; a second feed-forward RC network that is controlled by a second portion of a differential input signal; a first NPN transistor that is coupled to the first feed-forward RC network at its collector, wherein the first NPN transistor is diode-connected; a second NPN transistor that is coupled to the second feed-forward network at its collector, wherein the second NPN transistor is diode-connected; a third NPN transistor that is coupled to the first NPN at its base, wherein the ratio of the size of the third NPN transistor to the size of the first NPN is N to 1, and wherein N is greater than 1; a fourth NPN transistor that is coupled to the second NPN transistor at its base, wherein the ratio of the size of the fourth NPN transistor to the size of the second NPN transistor is N to 1; a first output terminal that is coupled to the collector of the third NPN transistor; a second output terminal that is coupled to the collector of the fourth NPN transistor; and a current source that is coupled to the emitters of the first, second, third, and fourth NPN transistors.

In accordance with a preferred embodiment of the present invention, the apparatus further comprises: a first input terminal that receives the first portion of the differential input signal; a second input terminal that receives the second portion of the differential input signal; a fifth NPN transistor that is coupled to the third NPN transistor at its emitter and that is coupled to the first input terminal at its base; and a sixth NPN transistor that is coupled to the fourth NPN transistor at its emitter and that is coupled to the second input terminal at its base, wherein the fifth NPN transistor is about the same size as the fourth NPN.

In accordance with a preferred embodiment of the present invention, the current source further comprises a first current source, and wherein the apparatus further comprises: a second current source that is coupled to the emitter of the fifth NPN transistor; and a third current source that is coupled to the emitter of the sixth NPN transistor.

In accordance with a preferred embodiment of the present invention, the apparatus further comprises a bypass capacitor that is coupled between the emitters of the third and fourth NPN transistors.

In accordance with a preferred embodiment of the present invention, the apparatus further comprises: a first resistor that is coupled between emitter of the fifth NPN transistor and the collector of the third NPN transistor; and a second resistor that is coupled between emitter of the sixth NPN transistor and the collector of the fourth NPN transistor, wherein the first resistor is about the same resistance as the second resistor.

In accordance with a preferred embodiment of the present invention, the first and second feed-forward RC network each further comprise: a third resistor, wherein the ratio of the resistance of the first resistor to the resistance of the third resistor is 1 to N; and a capacitor that is coupled in parallel to the third resistor.

In accordance with a preferred embodiment of the present invention, the apparatus further comprises: a seventh NPN transistor that is coupled to the first feed-forward RC network at its emitter and that is coupled to the second input terminal at its base; and an eighth NPN transistor that is coupled to the second feed-forward RC network at its emitter and that is coupled to the first input terminal at its base.

In accordance with a preferred embodiment of the present invention, an apparatus is provided. The apparatus comprises a supply rail; a first input terminal that receives a first portion of a differential input signal; a second input terminal that receives a second portion of the differential input signal; a first NPN transistor that is coupled to the supply rail at its collector and that is coupled to the second input terminal at its base, wherein the first NPN transistor has a first size; a second NPN transistor that is coupled to the supply rail at its collector and that is coupled to the first input terminal at its base, wherein the second NPN transistor has the first size; a third NPN transistor that is coupled to the supply rail at its collector and that is coupled to the first input terminal at its base, wherein the third NPN transistor has a second size, wherein the ratio of the first size to the second size is 1 to N, wherein N is greater than 1; a fourth NPN transistor that is coupled to the supply rail at its collector and that is coupled to the second input terminal at its base, wherein the fourth NPN transistor has the second size; a first resistor that is coupled to the emitter of the first NPN transistor, wherein the first resistor has a first resistance; a second resistor that is coupled to the emitter of the second NPN transistor, wherein the second resistor has the first resistance; a third resistor that is coupled to the emitter of the third NPN transistor, wherein the third resistor has a second resistance, and wherein the ratio of the first resistance to the second resistance is N to 1; a fourth resistor that is coupled to the emitter of the fourth NPN transistor, wherein the fourth resistor has the second resistance; a first capacitor that is coupled in parallel to the first resistor; a second capacitor that is coupled in parallel to the second resistor; a fifth NPN transistor that is coupled to the first resistor at its collector, wherein the fifth NPN transistor is diode-connected, and wherein the fifth NPN transistor has a third size; a fifth resistor that is coupled to the emitter of the fifth NPN transistor, wherein the fifth resistor has a third resistance; a sixth NPN transistor that is coupled to the second resistor at its collector, wherein the six NPN transistor is diode-connected, and wherein the sixth NPN transistor has the third size; a sixth resistor that is coupled to the emitter of the sixth NPN transistor, wherein the sixth resistor has the third resistance; a seventh NPN transistor that is coupled to the third resistor at its collector and that is coupled to the base of the fifth NPN transistor at its base, wherein the seventh NPN transistor has a fourth size, and wherein the ratio of the third size to the fourth size is 1 to N; a seventh resistor that is coupled to the emitter of the seventh NPN transistor, wherein the seventh resistor has a fourth resistance, wherein the ratio of the third resistance to the fourth resistance is N to 1; an eighth NPN transistor that is coupled to the fourth resistor at its collector and that is coupled to the base of the sixth NPN transistor at its base, wherein the eighth NPN transistor has the fourth size; an eighth resistor that is coupled to the emitter of the eighth NPN transistor, wherein the eighth resistor has the fourth resistance; and a current source that is coupled to the fifth, sixth, seventh, and eighth resistors.

In accordance with a preferred embodiment of the present invention, the current source further comprises a first current source, and wherein the apparatus further comprises: a third capacitor that is coupled between the emitters of the seventh and eight NPN transistors; a ninth resistor that is coupled between the collectors of the fifth and sixth NPN transistors; a second current source that is coupled to the collector of the fifth NPN transistor; a third current source that is coupled to the collector of the sixth NPN transistor; a fourth current source that is coupled to the emitter of the third NPN transistor; and a fifth current source that is coupled to the emitter of the fourth NPN transistor.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
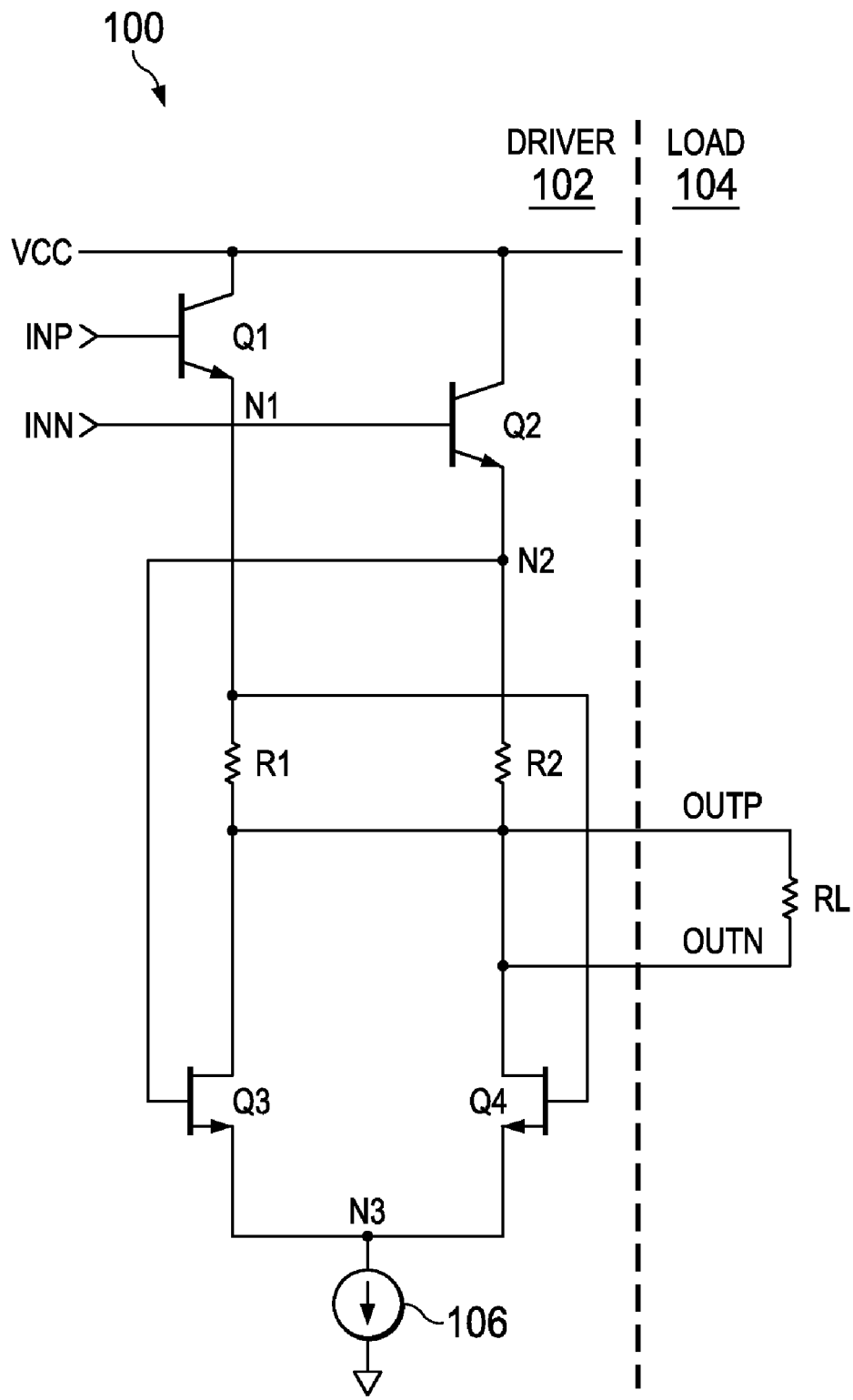
FIG. 1 is an example of a conventional circuit for a driver that employs both bipolar and CMOS transistors.

Refer now to the drawings wherein depicted elements are, for the sake of clarity, not necessarily shown to scale and wherein like or similar elements are designated by the same reference numeral through the several views.

Figure 2:
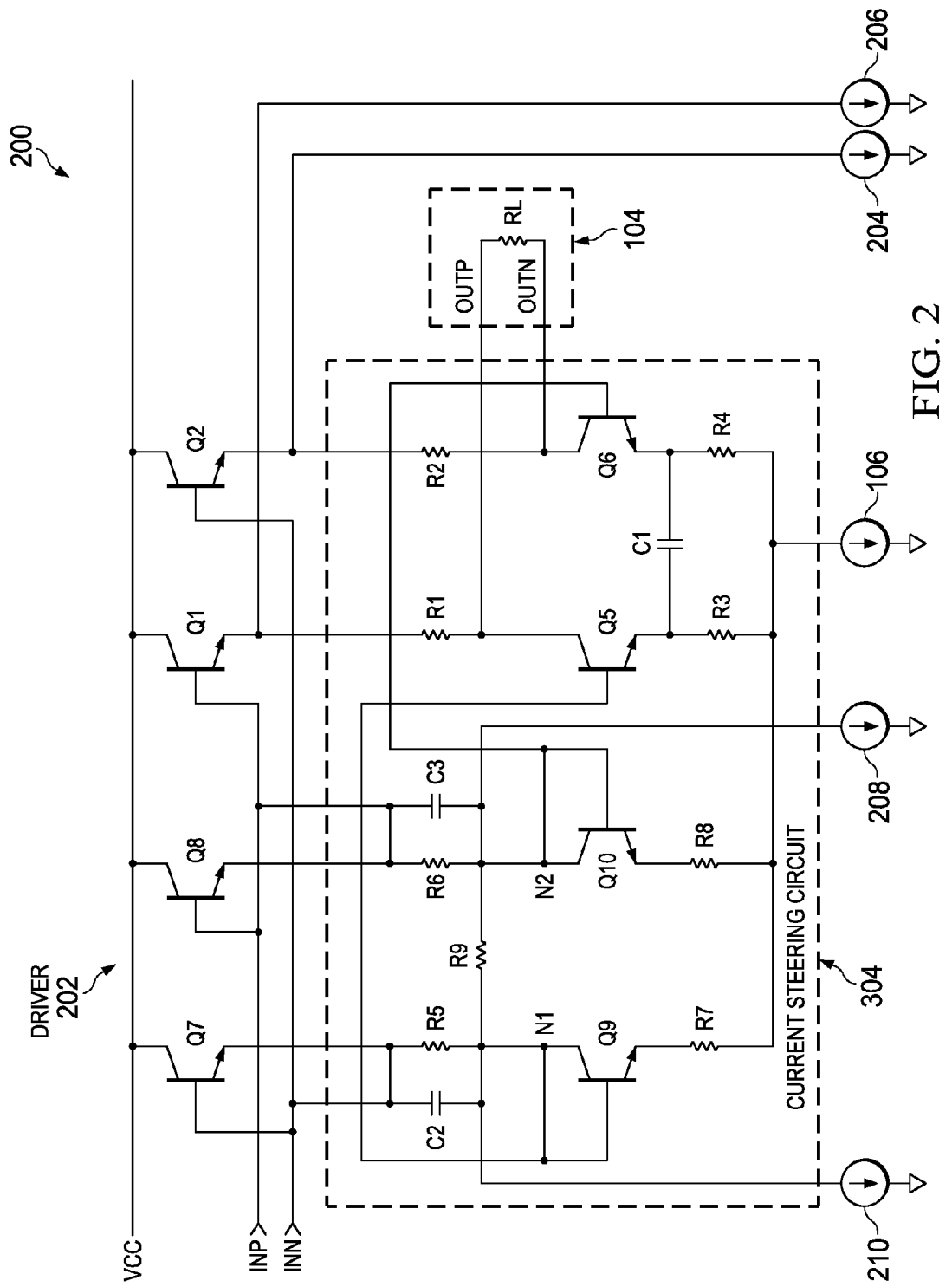
FIG. 2 is an example of a circuit in accordance with a preferred embodiment of the present invention.

Referring to FIG. 2 of the drawings, the reference numeral 200 generally designates a circuit in accordance with a preferred embodiment of the present invention. Circuit 200 generally comprises a driver 302 (which uses a combination of voltage mode or VM and current mode or CM) and load 104. Driver 302 generally comprises driving NPN transistors Q1, Q2, Q7, and Q8, current sources 106, 204, and 206, and current steering circuit 304. Additionally, current steering circuit 304 generally comprises feed-forward resistor-capacitor (RC) networks (which are generally comprised of resistors R5 and R6 and capacitors C2 and C3), input NPN transistors Q9 and Q10, output NPN transistors Q5 and Q6, current sources 208 and 210, resistors, R1 through R4 and R7 through R8, and bypass capacitor C1. In operation, (similar to driver 102) driver 302 provides current through output terminals OUTP and OUTN to drive the load 104. Also, in an alternative arrangement, the NPN transistors can be replaced with PNP transistors.

In a first state, when a logic high or "1" is applied to terminal INP and a logic low or "0" is applied to terminal INN, current flows out through terminal OUTP and in through terminal OUTN. To accomplish this, transistors Q8 and Q1 are turned "on", while transistors Q7 and Q2 are "off". Current is sourced from transistor Q1 through resistor R1 (which is typically about 40Ω) to terminal OUTP. Also, current is applied to the base and collector of transistor Q10 (which is diode-connected) and to the base of transistor Q6. The configuration of transistors Q10 and Q6 appears to be a current mirror, but their emitters are not coupled to a fixed voltage. Instead, transistors Q10 and Q6 are coupled to current source 106; in other words, the current is not "mirrored" from one side to the other, but is "shared" by both sides. Thus, transistor Q8 "steers" current through transistors Q6 and Q10. Since the size of transistor Q10 is much smaller than that of transistor Q6, the majority of the current flows through transistor Q6. For example, the ratio of the magnitude of the currents is 5 to 1 when N is 5. To decrease transitions times for switching events, the resistor R6 (which is usually N times larger than resistor R2 and which, for example, can be 200Ω when N is 5) and capacitor C3 (which is typically about 100 fF) operate as a feed-forward RC network for transistors Q10 and Q6; alternatively, capacitor C3 can be directly coupled to terminal INP. Also, resistors R8 and R4 are coupled between the current source 106 and transistors Q10 and Q6 (respectively), where resistor R8 is N times larger than R4. For example, when N is 5, resistor R4 can be about 10Ω while resistor R8 can be about 50Ω.

In a second state, when a logic high or "1" is applied to terminal INN and a logic low or "0" is applied to terminal INP, current flows out through terminal OUTN and in through terminal OUTP. To accomplish this, transistors Q7 and Q2 are turned "on", while transistors Q8 and Q1 are "off". Current is sourced from transistor Q2 through resistor R2 (which is generally matched with resistor R1 and is typically about 40Ω) to terminal OUTN. Also, current is applied to the base and collector of transistor Q9 (which is diode-connected) and to the base of transistor Q5. Thus, transistor Q7 "steers" current through transistors Q5 and Q9. Transistors Q9 and Q5 (as with transistors Q10 and Q6) are scaled so that transistor Q5 is N times (typically, 5 times) larger than transistor Q9. Since transistor Q5 is much larger than transistor Q9, the majority of the current flows through transistor Q5. For example, the ratio of the magnitude of the currents in Q5 and Q9 is 5 to 1 when N is 5. Additionally, to decrease transitions times for switching events, the resistor R5 (which is generally matched with resistor R6 and which, for example, can be 200Ω) and capacitor C2 (which is typically about 100 fF) operate as a feed-forward RC network for transistors Q9 and Q5; alternatively, capacitor C2 can be directly coupled to terminal INN. Also, resistors R7 and R3 are coupled between the current source 106 and transistors Q9 and Q5 (respectively), where resistors R7 and R3 are generally matched with resistors R8 and R4 (respectively). For example, resistor R3 can be about 10Ω while resistor R7 can be about 50Ω.

Additionally, there are several other components that are provided to assist in improving performance. Current sources 204 and 206, which are coupled to the emitters of transistors Q1 and Q2 (respectively), operate to generally ensure that transistors Q1 and Q2 are generally never completely "off", which improves the turn on or transition time for transistors Q1 and Q2. Current sources 208 and 210, which are coupled to the bases of the transistors Q9 and Q10 (respectively), generally operate to lower the voltages on the bases of transistors Q5 and Q6 so that the base-collector diodes in these transistors are generally never forward-biased. Capacitor C1 (which is generally about 100 fF) is coupled between the emitters of transistors Q5 and Q6, which generally operates as a bypass capacitor for high frequency components. Also, resistor R9 (which is generally N times the resistance of RL) is coupled between the collectors of transistors Q9 and Q10. Additionally, transistors Q7 and Q8 (which are generally matched with one another) are N times smaller than transistors Q1 and Q2 (which are also generally matched with one another).

With the configuration of driver 202, several advantages can be realized. Because the impedance is low at nodes N1 and N2, transitions times (or delays) are reduced, which increases the speed of the driver 202 over conventional drivers using voltage controlled differential pair(s). Moreover, because the voltage swing is smaller at node1 N1 and N2, driver 202 produces smaller output common-mode voltage fluctuation than drivers with large input voltage to the different pair(s).

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
   a first feed-forward RC network that is controlled by a first portion of a differential input signal;
   a second feed-forward RC network that is controlled by a second portion of a differential input signal;
   a first NPN transistor that is coupled to the first feed-forward RC network at its collector, wherein the first NPN transistor is diode-connected;
   a second NPN transistor that is coupled to the second feed-forward network at its collector, wherein the second NPN transistor is diode-connected;
   a third NPN transistor that is coupled to the first NPN at its base, wherein the ratio of the size of the third NPN transistor to the size of the first NPN is N to 1, and wherein N is greater than 1;
   a fourth NPN transistor that is coupled to the second NPN transistor at its base, wherein the ratio of the size of the fourth NPN transistor to the size of the second NPN transistor is N to 1;
   a first output terminal that is coupled to the collector of the third NPN transistor;
   a second output terminal that is coupled to the collector of the fourth NPN transistor; and
   a current source that is coupled to the emitters of the first, second, third, and fourth NPN transistors.

2. The apparatus of claim 1, wherein N is 5.

3. The apparatus of claim 1, wherein the apparatus further comprises:
   a first input terminal that receives the first portion of the differential input signal;
   a second input terminal that receives the second portion of the differential input signal;
   a fifth NPN transistor that is coupled to the third NPN transistor at its emitter and that is coupled to the first input terminal at its base; and
   a sixth NPN transistor that is coupled to the fourth NPN transistor at its emitter and that is coupled to the second input terminal at its base, wherein the fifth NPN transistor is about the same size as the fourth NPN.

4. The apparatus of claim 3, wherein the current source further comprises a first current source, and wherein the apparatus further comprises:
   a second current source that is coupled to the emitter of the fifth NPN transistor; and
   a third current source that is coupled to the emitter of the sixth NPN transistor.

5. The apparatus of claim 3, wherein the apparatus further comprises:
   a seventh NPN transistor that is coupled to the first feed-forward RC network at its emitter and that is coupled to the second input terminal at its base; and
   an eighth NPN transistor that is coupled to the second feed-forward RC network at its emitter and that is coupled to the first input terminal at its base.

6. The apparatus of claim 3, wherein the apparatus further comprises a bypass capacitor that is coupled between the emitters of the third and fourth NPN transistors.

7. The apparatus of claim 6, wherein the apparatus further comprises:
   a first resistor that is coupled between emitter of the fifth NPN transistor and the collector of the third NPN transistor; and
   a second resistor that is coupled between emitter of the sixth NPN transistor and the collector of the fourth NPN transistor, wherein the first resistor is about the same resistance as the second resistor.

8. The apparatus of claim 7, wherein the first and second feed-forward RC network each further comprise:
   a third resistor, wherein the ratio of the resistance of the first resistor to the resistance of the third resistor is N to 1; and
   a capacitor that is coupled in parallel to the third resistor.

9. The apparatus of claim 8, wherein the capacitor from each of the first and second feed-forward RC networks is coupled to the second and first input terminals, respectively.

10. An apparatus comprising:
    a first feed-forward resistor-capacitor (RC) network that is controlled by a first portion of a differential input signal;
    a second feed-forward RC network that is controlled by a second portion of a differential input signal;
    a first input transistor that is coupled to the first feed-forward RC network;
    a second input transistor that is coupled to the second feed-forward network;
    a first output transistor that is coupled to the first input transistor at its control electrode, wherein the ratio of the size of the first output transistor to the size of the first input transistor is N to 1, and wherein N is greater than 1;
    a second output transistor that is coupled to the second input transistor at its control electrode, wherein the ratio of the size of the second output transistor to the size of the second input transistor is N to 1;
    a first output terminal that is coupled to the first output transistor;
    a second output terminal that is coupled to the second output transistor; and
    a current source that is coupled to the first input transistor, the second input transistor, the first output transistor, and the second output transistor.

11. The apparatus of claim 10, wherein N is 5.

12. The apparatus of claim 10, wherein the apparatus further comprises:
    a first input terminal that receives the second portion of the differential input signal;
    a second input terminal that receives the first portion of the differential input signal;
    a first driving transistor that is coupled to the first output transistor at its first passive electrode and that is coupled to the first input terminal at its control electrode; and
    a second driving transistor that is coupled to the second output transistor at its first passive electrode and that is coupled to the second input terminal at its control electrode, wherein the first driving transistor is about the same size as the second driving transistor.

13. The apparatus of claim 12, wherein the current source further comprises a first current source, and wherein the apparatus further comprises:
    a second current source that is coupled to the first passive electrode of the first driving transistor; and
    a third current source that is coupled to the first passive electrode of the second driving transistor.

14. The apparatus of claim 12, wherein the apparatus further comprises:
    a third driving transistor that is coupled to the first feed-forward RC network at its first passive electrode and that is coupled to the second input terminal at its control electrode; and
    a fourth driving transistor that is coupled to the second feed-forward RC network at its first passive electrode and that is coupled to the first input terminal at its control electrode.

15. The apparatus of claim 12, wherein the apparatus further comprises a bypass capacitor that is coupled between the first output transistor and the second output transistor.

16. The apparatus of claim 15, wherein the apparatus further comprises:
   a first resistor that is coupled between the first passive electrode of the first driving transistor and a first passive electrode of the first output transistor; and
   a second resistor that is coupled between the first passive electrode of the second driving transistor and a first passive electrode of the second output transistor, wherein the first resistor is about the same resistance as the second resistor.

17. The apparatus of claim 16, wherein the first and second feed-forward RC network each further comprise:
   a third resistor, wherein the ratio of the resistance of the first resistor to the resistance of the third resistor is 1 to N; and
   a capacitor that is coupled in parallel to the third resistor.

18. The apparatus of claim 17, wherein the capacitor from each of the first and second feed-forward RC networks is coupled to the second and first input terminals, respectively.

19. An apparatus comprising:
   a supply rail;
   a first input terminal that receives a first portion of a differential input signal;
   a second input terminal that receives a second portion of the differential input signal;
   a first NPN transistor that is coupled to the supply rail at its collector and that is coupled to the second input terminal at its base, wherein the first NPN transistor has a first size;
   a second NPN transistor that is coupled to the supply rail at its collector and that is coupled to the first input terminal at its base, wherein the second NPN transistor has the first size;
   a third NPN transistor that is coupled to the supply rail at its collector and that is coupled to the first input terminal at its base, wherein the third NPN transistor has a second size, wherein the ratio of the first size to the second size is 1 to N, wherein N is greater than 1;
   a fourth NPN transistor that is coupled to the supply rail at its collector and that is coupled to the second input terminal at its base, wherein the fourth NPN transistor has the second size;
   a first resistor that is coupled to the emitter of the first NPN transistor, wherein the first resistor has a first resistance;
   a second resistor that is coupled to the emitter of the second NPN transistor, wherein the second resistor has the first resistance;
   a third resistor that is coupled to the emitter of the third NPN transistor, wherein the third resistor has a second resistance, and wherein the ratio of the first resistance to the second resistance is N to 1;
   a fourth resistor that is coupled to the emitter of the fourth NPN transistor, wherein the fourth resistor has the second resistance;
   a first capacitor that is coupled in parallel to the first resistor;
   a second capacitor that is coupled in parallel to the second resistor;
   a fifth NPN transistor that is coupled to the first resistor at its collector, wherein the fifth NPN transistor is diode-connected, and wherein the fifth NPN transistor has a third size;
   a fifth resistor that is coupled to the emitter of the fifth NPN transistor, wherein the fifth resistor has a third resistance;
   a sixth NPN transistor that is coupled to the second resistor at its collector, wherein the six NPN transistors are diode-connected, and wherein the sixth NPN transistor has the third size;
   a sixth resistor that is coupled to the emitter of the sixth NPN transistor, wherein the sixth resistor has the third resistance;
   a seventh NPN transistor that is coupled to the third resistor at its collector and that is coupled to the base of the fifth NPN transistor at its base, wherein the seventh NPN transistor has a fourth size, and wherein the ratio of the third side to the fourth size is 1 to N;
   a seventh resistor that is coupled to the emitter of the seventh NPN transistor, wherein the seventh resistor has a fourth resistance, wherein the ratio of the third resistance to the fourth resistance is N to 1;
   an eighth NPN transistor that is coupled to the fourth resistor at its collector and that is coupled to the base of the sixth NPN transistor at its base, wherein the eighth NPN transistor has the fourth size;
   an eighth resistor that is coupled to the emitter of the eighth NPN transistor, wherein the eighth resistor has the fourth resistance; and
   a current source that is coupled to the fifth, sixth, seventh, and eighth resistors.

20. The apparatus of claim 19, wherein the current source further comprises a first current source, and wherein the apparatus further comprises:
   a third capacitor that is coupled between the emitters of the seventh and eight NPN transistors;
   a ninth resistor that is coupled between the collectors of the fifth and sixth NPN transistors;
   a second current source that is coupled to the collector of the fifth NPN transistor;
   a third current source that is coupled to the collector of the sixth NPN transistor;
   a fourth current source that is coupled to the emitter of the third NPN transistor; and
   a fifth current source that is coupled to the emitter of the fourth NPN transistor.

* * * * *